(12) United States Patent
Ueda et al.

(10) Patent No.: US 6,395,409 B2
(45) Date of Patent: May 28, 2002

(54) ORGANIC ELECTROLUMINESCENT ELEMENT

(75) Inventors: Hideaki Ueda, Kishiwada; Keiichi Furukawa; Yoshihisa Terasaka, both of Suita, all of (JP)

(73) Assignee: Minolta Co., Ltd., Osaka (JP)

( * ) Notice: Subject to any disclaimer, the term of this patent is extended or adjusted under 35 U.S.C. 154(b) by 0 days.

(21) Appl. No.: 09/162,322

(22) Filed: Sep. 28, 1998

(30) Foreign Application Priority Data

Sep. 29, 1997 (JP) .............................. 9-264102
Sep. 30, 1997 (JP) .............................. 9-267037
Jul. 31, 1998 (JP) ............................. 10-217039

(51) Int. Cl.$^7$ .......................... H05B 33/14; H05B 33/00
(52) U.S. Cl. ..................... 428/690; 313/505; 313/506
(58) Field of Search ............... 428/690, 917; 313/505, 506

(56) References Cited

U.S. PATENT DOCUMENTS

| | | | |
|---|---|---|---|
| 3,530,325 A | | 9/1970 | Mehl et al. |
| 4,539,507 A | | 9/1985 | VanSlyke et al. |
| 4,720,432 A | | 1/1988 | VanSlyke et al. |
| 4,885,211 A | | 12/1989 | Tang et al. |
| 5,364,654 A | * | 11/1994 | Hosokawa et al. ........... 427/66 |
| 5,429,884 A | | 7/1995 | Namiki et al. |
| 5,677,572 A | * | 10/1997 | Hung et al. ................. 257/750 |
| 5,739,635 A | * | 4/1998 | Wakimoto .................. 313/504 |
| 5,783,292 A | * | 7/1998 | Tokito et al. ................ 428/212 |
| 5,949,186 A | * | 9/1999 | Nagayama et al. ......... 313/504 |
| 5,969,474 A | * | 10/1999 | Arai ............................. 313/504 |
| 6,023,073 A | * | 2/2000 | Strite ........................... 257/40 |

FOREIGN PATENT DOCUMENTS

| | | |
|---|---|---|
| JP | 59194393 | 11/1984 |
| JP | 63295695 | 12/1988 |
| JP | 0337994 A | 2/1991 |
| JP | 04132189 A | 5/1992 |
| JP | 04132191 A | 5/1992 |
| JP | 07142168 A | 6/1995 |
| JP | 07268317 A | 10/1995 |

OTHER PUBLICATIONS

Institute of Electronics, Information and Communications Engineers (IEICE), Spring Conference Proceedings, 5–347, 5–348, 1993 (full translation attached).

Hung, L.S., C.W. Tang and M.G. Mason "Enhanced electron injection in organic electroluminescence devices using an Al/LiF electrode" *Appl. Phys. Lett.*70(2):152–154 (1997).

* cited by examiner

*Primary Examiner*—Cynthia H. Kelly
*Assistant Examiner*—Dawn Garrett
(74) *Attorney, Agent, or Firm*—Morrison & Foerster LLP (57) ABSTRACT

The present invention relates to an organic eletroluminescent element comprising an anode, an organic luminous layer, an electron-injection layer and a cathode, in which the electron-injection layer comprises a metal oxide or a metal halide, and a material different from the metal halide or metal oxide.

21 Claims, 2 Drawing Sheets

ORGANIC ELECTROLUMINESCENT ELEMENT

This application is based on Japanese Patent Application Nos. Hei 9-264102, Hei 9-267037 and Hei 10-217039, respectively filed in Japan Sep. 29, 1997, Sep. 30, 1997 and Jul. 31, 1998, the contents of which are hereby incorporated by reference.

BACKGROUND OF THE INVENTION

1. Field of the Invention

The present invention relates to an organic electroluminescent element.

2. Description of the Prior Art

The organic electroluminescent element emit light in accordance with electric signals and is constituted of an organic compound as a luminous material.

The organic electroluminescent element is basically constituted of an organic luminous layer and a pair of electrodes with the luminous layer sandwiched between the electrodes. Luminescence is a phenomenon in which electrons are injected from one electrode and holes are injected from the other electrode so that the luminous material in the luminous layer is excited to a higher energy level and then the excited luminous material goes down to a ground state to emit extra energy as light.

In addition to the above basic structure, a hole-injection layer for injecting holes is formed on the hole-injection electrode or an electron-injection layer is formed on the electron-injection electrode in order to improve luminous efficiency.

U.S. Pat. No. 3,530,325 discloses an example of electroluminescent elements in which single crystal anthracene is contained as a luminous material. Japanese Patent Laid-Open No. Sho 59-194,393 proposes the combination of a hole-injection layer with an organic luminous layer. Japanese Patent Laid-Open No. Sho 63-295,695 proposes the combination of an organic hole-injection transporting layer with an organic electron-injection transporting layer.

Those laminated eletroluminescent element has a structure in which an organic fluorescent material, a charge-transporting organic compound (charge-transporting material) and electrodes are laminated. Holes and electrons injected from respective electrode move in the charge-transporting material and are recombined to emit light. An organic pigments which can emit fluorescenct light, such as 8-qunolinol aluminum complex and cumarin, are used as the organic fluorescent material. The electron-transporting material is, for example, exemplified by amino compounds, such as N,N'-di(m-tolyl)N,N'-diphenyl benzidine and 1,1-bis[N,N-di(p-tolyl)aminophenyl]cyclohexane, and 4-(N,N-diphenyl)aminobenzaldehyde-N,N-diphenyl hydrazone. In addition, porphyrin, such as cupper phthalocyanine, is proposed.

By the way, organic electroluminescent element has a high luminous properties. Stability at light-emitting time and preserving stability, however, are not sufficient for the electroluminescent element to be put into practical use. The stability of charge-transporting material is pointed out as one of problems with respect to the light-emitting stability and preserving stability of the element. A layer constituted by an organic material in the electroluminescent element is several tens of nm to several hundred of nm in thickness, being very thin. A voltage applied to the layer in unit of thickness is very high. As heat is emitted at light-emitting time or in electriferous conditions, the charge-transporting material is required to have electrical stability, thermal stability or chemical stability.

Japanese Patent Laid-Open Nos. Hei 2-15,595, Hei 3-37,994, Hei 4-132,191 and Hei 5-121,172 disclose that materials other than aluminum is used as cathode in order to lower light luminescence-starting voltage of an electroluminescence element.

Japanese Patent Laid-Open Nos. Hei 4-132,189 and Hei 7-268, 317 disclose that a layer constituted of a mixture of an electron transporting material and metal is used as an electron-injection layer.

The handling of the material other than aluminum is difficult in layer-forming conditions and the material is liable to be oxidized. The same problem arises when the mixture of the electron transporting material and metal.

When metal used for formation of an electron-injection layer is oxidized at vapor deposition time, powdery ones are formed. A uniform layer can not be formed. White haze occurs. Metallic layer is not formed. The formed one can not be used as an electrode.

A layer having excellent properties as an electron-injection layer has not been obtained yet as things are.

SUMMARY OF THE INVENTION

The present invention is to provide an electroluminescent element having high luminous strength and displaying stable performance even if used repeatedly.

The present invention relates to an organic electroluminescent element comprising an anode, an organic luminous layer, an electron-injection layer and a cathode, in which the electron-injection layer comprises a metal oxide or a metal halide, and a different material therefrom.

DETAILED DESCRIPTION OF THE PREFERRED EMBODIMENTS

The present invention relates to an organic electroluminescent element comprising an anode, an organic luminous layer, an electron-injection layer and a cathode, in which the electron-injection layer comprises a metal oxide or a metal halide, and a different material therefrom.

The electroluminescent element of the present invention has at least a luminous layer and an electron-injection layer between a pair of an anode and a cathode. The present invention is basically characterized in that the electron-injection layer is a composite layer comprising a metal oxide, a metal halide and a different material therefrom.

Figure 1:
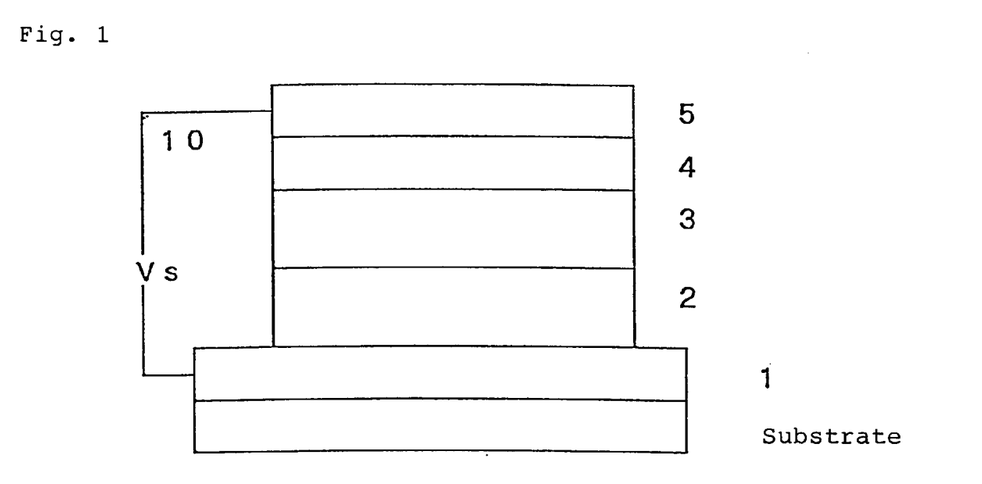
FIG. 1 is a schematic sectional view illustrating one embodiment of organic electroluminescence elements.

The present invention is further explained by referring to FIG. 1. In FIG. 1, the reference number 1 is an anode. On the anode, a hole-injection transporting layer 2, an organic luminous layer 3, an electron-injection layer 4 and a cathode 5 are laminated in the order.

It is preferred that an electrically conductive substance to be used for an anode 1 of the organic electroluminescent element has a work function of more than 4 eV. Conductive substances such as carbon, aluminum, vanadium, iron, cobalt, nickel, copper, zinc, tungsten, silver, tin, gold, etc., and an alloy thereof, tin oxide, indium oxide, antimony oxide, zinc oxide or zirconium oxide are used.

It is preferred that a metal forming a cathode 5 has a work function of less than 4 eV. Magnesium, calcium, titanium, yttrium, lithium, gadolinium, ytterbium, ruthenium, manganese, indium and an alloy thereof are used.

In the organic electroluminescent element, it is necessary that at least the anode 1 or the cathode 5 is a transparent electrode so that emission is observed. In this case, if the transparent electrode is used for the cathode, the transparency is easily deteriorated. Therefore, it is preferred that the transparent electrode is used for the anode.

When the transparent electrode is formed, it may be formed using the above-mentioned conductive substances, by means of vapor deposition, spattering, sol-gel method, or applying resin in which the above conductive substance is dispersed, etc., so that the desired transparency and conductivity are secured.

The transparent substrate is not specifically limited as long as it has suitable strength, is not affected by heat due to deposition, etc. at the time of preparing an organic electroluminescence element, and is transparent. Examples thereof include glass substrate, transparent resin such as polyethylene, polypropylene, polyethersulfon or polyetherketone. As the transparent electrode formed on the glass substrate, commercially available ITO, NESA, etc., are known. They may also be used.

FIG. 1 shows a construction with the hole-injection transporting layer 2 formed on the anode 1. The hole-injection transporting layer 2 can be formed by means of a vapor deposition of a compound, a dip coating or spin coating of the compound.

When the hole-injection transporting layer is formed by a deposition method, the thickness thereof is normally 1 to 200 nm, preferably 5 to 100 nm. When the hole-injection transporting layer is formed by the coating method, the thickness thereof is normally about 5 to 500 nm. The thicker the thickness of the layer, the higher the applied voltage is required, which results in the degradation of luminous efficiency. The deterioration of an electroluminescent element is liable to occur. If the thickness of the layer is smaller, the luminous efficiency is improved, however, the electroluminescence element easily causes breakdown, which shortens its life.

Examples of the hole-transporting material to be used for the hole-injection transporting layer include known compounds such as N,N'-diphenyl-N,N'-bis(3-methylphenyl)-1,1'-diphenyl-4,4'-diamine, N,N'-diphenyl-N,N'-bis(4-methylphenyl)-1,1'-diphenyl-4,4'-diamine, N,N'-diphenyl-N,N'-bis(1-naphthyl)-1,1'-diphenyl-4,4'-diamine, N,N'-diphenyl-N,N'-bis(2-naphthyl)-1,1'-diphenyl-4,4'-diamine, N,N'-tetra(4-methylphenyl)-1,1'-diphenyl-4,4'-diamine, N,N'-tetra(4-methylphenyl)-1,1'-bis(3-methylphenyl)-4,4'-diamine, N,N'-diphenyl-N,N'-bis(3-methylphenyl)-1,1'-bis(3-methylphenyl)-4,4'-diamine, N,N'-bis(N-carbazolyl)-1,1'-diphenyl-4,4'-diamine, 4,4',4"-tris(N-carbazolyl) triphenylamine, N,N',N"-triphenyl-N,N',N"-tris(3-methylphenyl)-1,3,5-tri(4-aminophenyl)benzene, 4,4',4"-tris[N,N',N"-triphenyl-N,N',N"-tris (3-methylphenyl)] triphenylamine and the like. They may be used in a mixture of more than one compounds.

The organic luminous layer 3 is formed on the hole-injection transporting layer 2. Examples of an organic luminous material to be used for the organic luminous layer 3 include those which are known to the art. For example, epidorisin, 2,5-bis[5,7-di-t-pentyl-2-benzoxazolyl]-thiophene, 2,2'-(1,4-phenylenedivinylene)bisbenzothiazole, 2,2'-(4,4'-biphenylene)bisbenzothiazole, 5-methyl-2-{2-[4-(5-methyl-2-benzoxazolyl)phenyl]vinyl}benzoxazole, 2,5-bis(5-methyl-2-benzoxazolyl)thiophene, anthracene, naphthalene, phenanthrene, pyrene, chrysene, perylene, perynone, 1,4-diphenylbutadiene, tetraphenylbutadiene, coumarin, acridine, stilbene, 2-(4-biphenyl)-6-phenylbenzoxazole, aluminum trisoxine, magnesium bisoxine, bis(benzo-8-quinolinol)zinc, bis(2-methyl-8-quinolinol)-aluminum oxide, indium trisoxine, aluminum tris(5-methyloxine), lithium oxine, gallium trisoxine, calcium bis(5-chloroxine), poly(zinc-bis(8-hydroxy-5-quinolinolyl) methane), dilithium epindolision, zinc bisoxine, 1,2-phthaloperynone, 1,2-naphthaloperynone and the like.

Further, conventional fluorescent dyes such as fluorescent coumarine dye, fluorescent perylene dye, fluorescent pyran dye, fluorescent thiopyran dye, fluorescent polymethine dye, fluorescent mecyanin dye, fluorescent imidazole dye, etc. can be used. Among them, chelating oxynoid compounds are particularly preferred.

The organic luminous layer may be composed of a single layer construction of the above-mentioned luminous substance. It may also be composed of a multi-layer construction in order to adjust the properties such as luminous color or luminous intensity. Further, the luminous layer may be formed with two or more luminous substances or doped with luminous substances.

When the luminous layer is formed by a deposition method, the thickness thereof is normally 1 to 200 nm, preferably 1 to 100 nm. When the luminous layer is formed by a coating method, the thickness thereof is normally about 5 to 500 nm. The thicker the thickness of the layer, the higher the applied voltage is required, which results in the degradation of luminous efficiency. The deterioration of an electroluminescent element is liable to occur. If the thickness of the layer is smaller, the luminous efficiency is improved, however, the electroluminescent, element easily causes breakdown, which shortens its life.

On the luminous layer 3, a composite layer comprising a metal oxide, a metal halide and a different material therefrom is formed as the electron-injection layer 4.

It is preferred that metal oxides or metal halides to be mixed in the electron-injection layer have a work function of less than 4.2 eV. As such, magnesium oxide, magnesium fluoride, calcium fluoride, strontium fluoride, yttrium oxide, strontium oxide, yttrium fluoride, lithium fluoride, lithium bromide, lithium oxide, magnesium bromide may be used. Magnesium fluoride, calcium fluoride, lithium fluoride, yttrium fluoride, lithium oxide, magnesium oxide, lithium bromide and yttrium oxide are preferred from the viewpoint of luminous properties and layer-forming properties.

The different material to be mixed with and contained in the electron-injection layer 4 is preferably a charge transporting material or a metal.

As the metals to be mixed in the electron-injection layer, aluminum, indium, silver, magnesium, and gold are used. Among those metals, aluminum, indium, silver and gold are preferable each of which has a work function of more than 4.2 eV.

The charge-transporting material contained in the electron-injection layer 4 may be exemplified by nitro-substituted fluorenone, anthraquinodimethane, diphenoquinone, thiopyrandioxide, oxadiazole, triazole, thiadiazole, cumarin, chelated oxynoid compound, and a derivative thereof. Among those, the chelated oxynoid compound are particularly preferred from the viewpoint of heat resistance.

When the organic luminous materials have charge-transporting ability, such the organic luminous materials may be used as an electron-transporting material of the electron-injection layer. In this case, it is preferable that the organic luminous material and the electron transporting material in the electron-injection layer are same. Such material may be exemplified by chelated oxynoid compound, benzoxazole complex, benzothiazole complex. Among those compounds, chelated oxynoid compound is preferable.

When the electron transporting material is mixed, its mixing ratio to metal oxide or matal halide (electron transporting material:metal oxide and/or metal halide) is 100:1 to 1:1.2, preferably 20:1 to 1:1.

When metal is mixed, its mixing ratio to metal oxide or metal halide (metal oxide and/or metal halide:metal) is 1:100 to 100:1, preferably 1:20 to 20:1.

The electron-injection layer may be formed by a vacuum vapor deposition method to have a layer thickness of 0.1 to 20 nm. The thicker the thickness of the layer, the higher the applied voltage is required to emit light, which results in the degradation of luminous efficiency. The deterioration of an electroluminescent element is liable to occur. If the thickness of the layer is smaller, it becomes difficult to form a uniform layer. Defects in the layer are liable to be formed. The luminous efficiency is also deteriorated. The life of eletroluminescent element is shortened. The layer thickness of, for example, the electron-injection layer can be measured by means of a layer-thickness measuring apparatus of crystal oscillator type.

The mixture of a metal oxide, a metal halide and a different material therefrom can be deposited to form a layer by many known methods, such as an electrical resistance heating method, an EB vapor deposition method, an ion plating method and an ionizing vapor deposition method.

Figure 2:
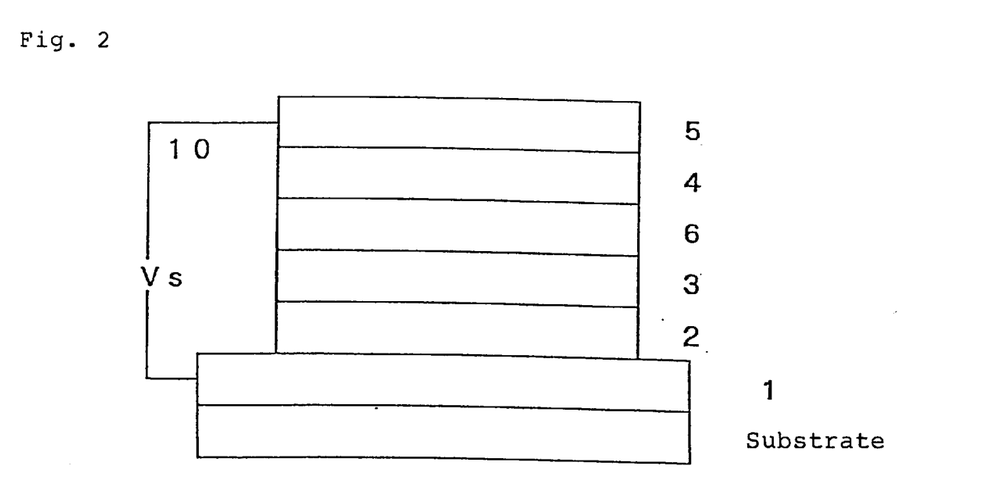
FIG. 2 is a schematic sectional view illustrating one embodiment of organic electroluminescent elements.
Figure 3:
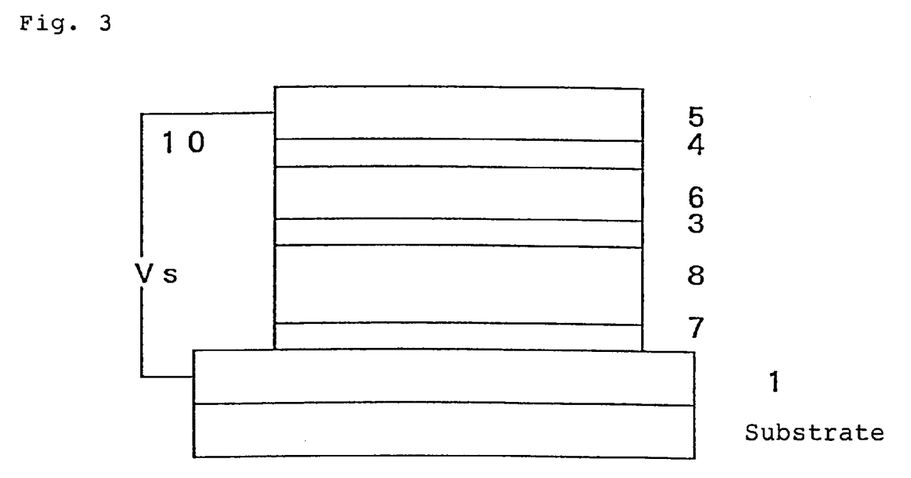
FIG. 3 is a schematic sectional view illustrating one embodiment of organic electroluminescent elements.
Figure 4:
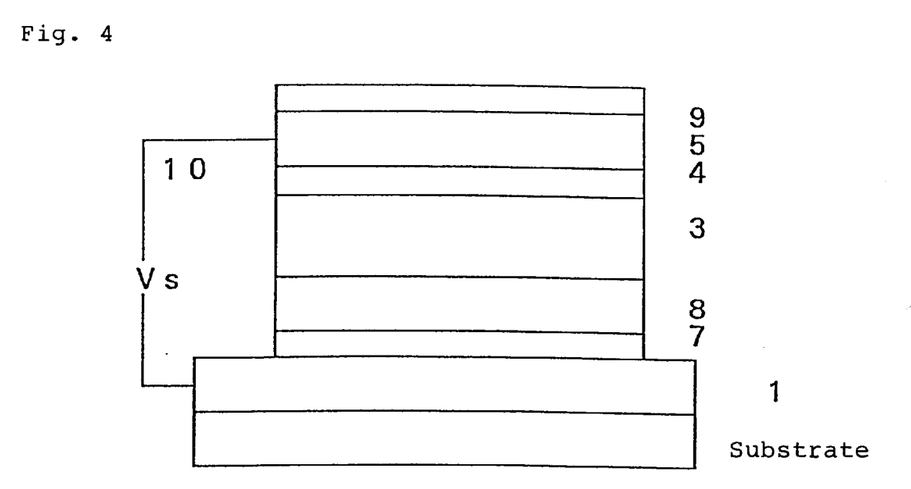
FIG. 4 is a schematic sectional view illustrating one embodiment of organic electroluminescent elements.

Different constitutions of electroluminescent element are shown in FIG. 2 to FIG. 4.

In FIG. 2, the reference number 1 is an anode. On the anode, a hole-injection transporting layer 2, an organic luminous layer 3, an electron transporting layer 6, an electron-injection layer 4 and a cathode 5 are laminated in the order. The above-mentioned electron-injection layer is a composite layer comprising a metal oxide, a metal halide and a different material therefrom.

In FIG. 3, the reference number 1 is an anode. On the anode, a hole-injection layer 7, a hole-transporting layer 8, an organic luminous layer 3, an electron-transporting layer 6, an electron-injection layer 4 and a cathode 5 are laminated in the order. The above-mentioned electron-injection layer is a composite layer comprising a metal oxide, a metal halide and a different material therefrom.

In FIG. 4, the reference number 1 is an anode. On the anode, a hole-injection layer 7, a hole-transporting layer 8, an organic luminous layer 3, an electron-injection layer 4, a cathode 5 and a sealing layer 9 are laminated in the order. The above-mentioned electron-injection layer is a composite layer comprising a metal oxide, a metal halide and a different material therefrom.

When the electron-transporting layer is formed as shown in FIG. 2 or FIG. 3, a layer thickness thereof is about 1 to 200 nm, preferably 1 to 100 nm. The same electron-transporting material as described in the electron-injection layer may be used as an electron-transporting material. When the luminous material has electron-transporting ability, the electron-transporting layer 6 may be formed with such a luminous material. In this case, it is preferable that the same material as that used in the electron-transporting layer is used in the luminous layer with the material doped. For example, when the electron-transporting layer may be formed with aluminum trisoxine, it is preferable that the luminous layer is formed with aluminum trisoxine doped with a luminant. The electron-transporting layer may be formed by means of a vapor deposition method, a coating method and other known method in a manner similar to the luminous layer formation.

In the organic electroluminescent element as shown in FIG. 3 or FIG. 4, the hole-injection transporting layer is divided functionally into two layers of the hole-injection layer 7 and the hole-transporting layer 8. Such the hole-injection layer 7 may be formed with a phthalocyanine compound, an electrically conductive polymer compound, an arylamine compound etc. by a vapor deposition method etc. to have a layer thickness of 1 to 30 nm. The hole-transporting layer 8 may be formed with a benzidine compound, an arylamine compound and a styryl compound etc. by a vapor deposition method etc. to have a layer thickness of 10 to 200 nm.

When the sealing layer 9 is formed as shown in FIG. 9, silicon oxide, zinc oxide, magnesium fluoride and magnesium oxide etc. are vapor-deposited to form a thin layer having a thickness of 5 to 1000 nm.

In a pair of transparent electrodes (i.e., the cathode 5 and the anode 1), a suitable leading wire (10) such as nichrome wire, gold wire, copper wire or platinum wire is connected to the electrodes. An organic electroluminescent element emits light by applying appropriate voltage to both electrodes.

When the electron-injection layer is formed of a composite layer comprising a metal oxide, a metal halide and a different material therefrom according to the present invention, electron-injecting properties are improved. It is thought that when its layer is formed to have a thin thickness of 0.1 to 20 nm, the flow of electrons is made smooth under a high electrical field, so that light luminescence-starting voltage necessary for an organic electroluminescent element to emit light may be low and that stable light emission may achieved a long period of time.

The organic electroluminescent element of the present invention is applicable to various indicator devices or display devices, etc.

The following are Examples to explain the present invention. Further, the organic electroluminescent element achieves the improvement in luminous efficiency and luminance, and long life. It should not be construed that the present invention is limited to a luminous substance, an auxiliary luminous material, a charge-transporting material, a sensitizer, resin, a material for electrodes, etc., and a method of preparing an element, which are used in Examples below.

EXAMPLE 1

N,N'-diphenyl-N,N'-bis(3-methylphenyl)-1,1'-biphenyl-4,4'-diamine was vapor-deposited as an organic hole-injection transporting layer on a glass substrate coated with indium tin oxide. The obtained layer had a thickness of 60 nm A thin layer having a thickness of 60 nm was formed by means of vacuum deposition with aluminum trisoxine serving as an organic luminous layer.

Lithium fluoride and aluminum trisoxine were co-deposited at a ratio of 1:10 (volume ratio) by means of an electrical resistance heating method to form an electron-injection layer having a layer thickness of 5 nm.

A thin layer having a thickness of 200 nm was formed by means of vapor deposition with aluminum to give a cathode.

In this way, an organic electroluminescent element was prepared.

EXAMPLE 2

N,N'-diphenyl-N,N'-bis(3-methylphenyl)-1,1'-diphenyl-4,4'-diamine was vapor-deposited as an organic hole-injection transporting layer on a glass substrate coated with indium tin oxide. The obtained layer had a thickness of 60 nm.

A thin layer having a thickness of 60 nm was formed by means of vapor deposition with aluminum trisoxine serving as an organic luminous layer.

Lithium fluoride and aluminum trisoxine were co-deposited at a ratio of 1:10 (volume ratio) by means of an electrical resistance heating method to form an electron-injection layer having a layer thickness of 2 nm.

A thin layer having a thickness of 200 nm was formed by means of vapor deposition with aluminum to give a cathode.

In this way, an organic electroluminescent element was prepared.

EXAMPLE 3

N,N'-diphenyl-N,N'-bis(3-methylphenyl)-1,1'-diphenyl-4,4'-diamine was vapor-deposited as an organic hole-injection transporting layer on a glass substrate coated with indium tin oxide. The obtained layer had a thickness of 60 nm A thin layer having a thickness of 60 nm was formed by means of vapor deposition with aluminum trisoxine serving as an organic luminous layer.

Lithium fluoride and aluminum trisoxine were co-deposited at a ratio of 1:5 (volume ratio) by means of an electrical resistance heating method to form an electron-injection layer having a layer thickness of 1 nm.

A thin layer having a thickness of 200 nm was formed by means of vapor deposition with aluminum to give a cathode.

In this way, an organic electroluminescent element was prepared.

EXAMPLE 4

N,N'-diphenyl-N,N'-bis(3-methylphenyl)-1,1'-diphenyl-4,4'-diamine was vapor-deposited as an organic hole-injection transporting layer on a glass substrate coated with indium tin oxide. The obtained layer had a thickness of 60 nm.

A thin layer having a thickness of 60 nm was formed by means of vapor deposition with aluminum trisoxine serving as an organic luminous layer.

Lithium fluoride and aluminum trisoxine were co-deposited at a ratio of 1:1 (volume ratio) by means of an electrical resistance heating method to form an electron-injection layer having a layer thickness of 0.5 nm.

A thin layer having a thickness of 200 nm was formed by means of vapor deposition with aluminum to give a cathode.

In this way, an organic electroluminescent element was prepared.

Comparative Example 1

An organic electroluminescent element was prepared in a manner similar to Example 1, except that an electron-injection layer was not formed.

EXAMPLE 5

N,N'-diphenyl-N,N'-bis(1-naphtyl)-1,1'-diphenyl-4,4'-diamine was vapor-deposited as an organic hole-injection transporting layer on a glass substrate coated with indium tin oxide. The obtained layer had a thickness of 55 nm A thin layer having a thickness of 10 nm was formed by means of co-deposition with aluminum trisoxine doped with rubrene at 5% by weight serving as an organic luminous layer.

Aluminum trisoxine was vapor-deposited to form a thin electron transporting layer having a thickness of 45 nm.

Magnesium fluoride and aluminum trisoxine were co-deposited at a ratio of 1:5 (volume ratio) by means of an electrical resistance heating method to form an electron-injection layer having a layer thickness of 2 nm.

A thin layer having a thickness of 200 nm was formed by means of vapor deposition with aluminum to give a cathode.

In this way, an organic electroluminescence element was prepared.

Comparative Example 2

An organic electroluminescent element was prepared in a manner similar to Example 5, except that magnesium was vapor-deposited by means of an electrical resistance heating method to form an electron-injection layer having 2 nm thickness.

Comparative Example 3

In example 5, magnesium and aluminum trisoxine were co-deposited at a ratio of 1:5 (volume ratio) by means of an electrical resistance heating method to form an electron-injection layer having a layer thickness of 2 nm. Then, a thin layer having a thickness of 200 nm was formed by means of vapor deposition with aluminum to give a cathode. In this way, an organic electroluminescent element was prepared.

Comparative Example 4

In example 5, an oxadiazole compound (A) represented by the formula below was vapor-deposited by means of an electrical resistance heating method to form an electron-injection layer having a layer thickness of 2 nm. Then, a thin layer having a thickness of 200 nm was formed by means of vapor deposition with aluminum to give a cathode. In this way, an organic electroluminescent element was prepared.

(A)

EXAMPLE 6

N,N'-diphenyl-N,N'-bis(1-naphtyl)-1,1'-diphenyl-4,4'-diamine was vapor-deposited as an organic hole-injection transporting layer on a glass substrate coated with indium tin oxide. The obtained layer had a thickness of 55 nm.

A thin layer having a thickness of 10 nm was formed by means of co-deposition with aluminum trisoxine doped with rubrene at 5% by weight as an organic luminous layer.

Aluminum trisoxine was vapor-deposited to form a thin electron transporting layer having a thickness of 45 nm.

Yttrium fluoride and aluminum trisoxine were co-deposited at a ratio of 1:1 (volume ratio) by means of an electrical resistance heating method to form an electron-injection layer having a layer thickness of 1 nm.

A thin layer having a thickness of 200 nm was formed by means of vapor deposition with aluminum to give a cathode.

In this way, an organic electroluminescent element was prepared.

EXAMPLE 7

4,4',4"-tris[N,N',N"-triphenyl-N,N',N"-tris(3-methylphenyl)]triphenylamine was vapor-deposited as a hole-injection layer on a glass substrate coated with indium tin oxide. The obtained layer had a thickness of 15 nm.

N,N'-diphenyl-N,N'-bis(4-methylphenyl)-1,1'-bis(3-methylphenyl)-4,4'-diamine was vapor-deposited as a hole-transporting layer on the hole-injection layer. The obtained layer had a thickness of 45 nm.

A thin layer having a thickness of 30 nm was formed by means of co-deposition with aluminum trisoxine doped with rubrene at 5% by weight as an organic luminous layer.

Aluminum trisoxine was vapor-deposited to form a thin electron-transporting layer having a thickness of 30 nm.

Magnesium fluoride and aluminum trisoxine were co-deposited at a ratio of 1:3 (volume ratio) by means of an electrical resistance heating method to form an electron-injection layer having a layer thickness of 2 nm.

A layer having a thickness of 200 nm was formed by means of vapor deposition with Mg and Ag, the atomic ratio of which was 10:1, to give a cathode.

In this way, an organic electroluminescent element was prepared.

EXAMPLE 8

N,N'-diphenyl-N,N'-bis(1-naphtyl)-1,1'-diphenyl-4,4'-diamine was vapor-deposited as an organic hole-injection transporting layer on a glass substrate coated with indium tin oxide. The obtained layer had a thickness of 55 nm.

A thin layer having a thickness of 10 nm was formed by means of co-deposition with aluminum trisoxine doped with rubrene at 5% by weight as an organic luminous layer.

Aluminum trisoxine was vapor-deposited to form a thin electron-transporting layer having a thickness of 45 nm.

Lithium bromide and aluminum trisoxine were co-deposited at a ratio of 1:1 (volume ratio) by means of an electrical resistance heating method to form an electron-injection layer having a layer thickness of 2 nm.

A layer having a thickness of 200 nm was formed by means of vapor deposition with aluminum to give a cathode.

In this way, an organic electroluminescent element was prepared.

EXAMPLE 9

N,N'-diphenyl-N,N'-bis(1-naphtyl)-1,1'-diphenyl-4,4'-diamine was vapor-deposited as an organic hole-injection transporting layer on a glass substrate coated with indium tin oxide. The obtained layer had a thickness of 55 nm.

A thin layer having a thickness of 10 nm was formed by means of co-deposition with aluminum trisoxine doped with rubrene at 5% by weight as an organic luminous layer.

Aluminum trisoxine was vapor-deposited to form a thin electron-transporting layer having a thickness of 45 nm.

Lithium oxide and aluminum trisoxine were co-deposited at a ratio of 1:1 (volume ratio) by means of an electrical resistance heating method to form an electron-injection layer having a layer thickness of 2 nm.

A layer having a thickness of 200 nm was formed by means of vapor deposition with aluminum to give a cathode.

In this way, an organic electroluminescent element was prepared.

EXAMPLE 10

N,N'-diphenyl-N,N'-bis (1-naphtyl)-1,1'-diphenyl-4,4'-diamine was vapor-deposited as an organic hole-injection transporting layer on a glass substrate coated with indium tin oxide. The obtained layer had a thickness of 55 nm.

A thin layer having a thickness of 10 nm was formed by means of co-deposition with aluminum trisoxine doped with rubrene at 5% by weight as an organic luminous layer.

Aluminum trisoxine was vapor-deposited to form a thin electron-transporting layer having a thickness of 45 nm.

Yttrium oxide and aluminum trisoxine were co-deposited at a ratio of 1:3 (volume ratio) by means of an electrical resistance heating method to form an electron-injection layer having a layer thickness of 1 nm.

A layer having a thickness of 200 nm was formed by means of vapor deposition with aluminum to give a cathode.

In this way, an organic electroluminescent element was prepared.

Comparative Example 5

An organic electroluminescent element was prepared in a manner similar to Example 7, except that an electron-injection layer was not formed.

EXAMPLE 11

N,N'-diphenyl-N,N'-bis(3-methylphenyl)-1,1'-biphenyl-4,4'-diamine was vapor-deposited as an organic hole-injection transporting layer on a glass substrate coated with indium tin oxide. The obtained layer had a thickness of 60 nm.

A thin layer having a thickness of 60 nm was formed by means of vacuum deposition with aluminum trisoxine serving as an organic luminous layer.

Lithium fluoride and aluminum were co-deposited at a ratio of 1:1 (volume ratio) by means of an electrical resistance heating method to form an electron-injection layer having a layer thickness of 1 nm.

A thin layer having a thickness of 200 nm was formed by means of vapor deposition with aluminum to give a cathode.

In this way, an organic electroluminescent element was prepared.

EXAMPLE 12

N,N'-diphenyl-N,N'-bis(3-methylphenyl)-1,1'-diphenyl-4,4'-diamine was vapor-deposited as an organic hole-injection transporting layer on a glass substrate coated with indium tin oxide. The obtained layer had a thickness of 60 nm.

A thin layer having a thickness of 60 nm was formed by means of vapor deposition with aluminum trisoxine serving as an organic luminous layer.

Lithium fluoride and aluminum were co-deposited at a ratio of 1:2 (volume ratio) by means of an electrical resistance heating method to form an electron-injection layer having a layer thickness of 3 nm.

A thin layer having a thickness of 200 nm was formed by means of vapor deposition with aluminum to give a cathode.

In this way, an organic electroluminescent element was prepared.

EXAMPLE 13

N,N'-diphenyl-N,N'-bis(3-methylphenyl)-1,1'-diphenyl-4,4'-diamine was vapor-deposited as an organic hole-injection transporting layer on a glass substrate coated with indium tin oxide. The obtained layer had a thickness of 60 nm.

A thin layer having a thickness of 60 nm was formed by means of vapor deposition with aluminum trisoxine serving as an organic luminous layer.

Lithium fluoride and indium were co-deposited at a ratio of 1:5 (volume ratio) by means of an electrical resistance heating method to form an electron-injection layer having a layer thickness of 1 nm.

A thin layer having a thickness of 200 nm was formed by means of vapor deposition with aluminum to give a cathode.

In this way, an organic electroluminescent element was prepared.

EXAMPLE 14

N,N'-diphenyl-N,N'-bis(3-methylphenyl)-1,1'-diphenyl-4,4'-diamine was vapor-deposited as an organic hole-injection transporting layer on a glass substrate coated with indium tin oxide. The obtained layer had a thickness of 60 nm.

A thin layer having a thickness of 60 nm was formed by means of vapor deposition with aluminum trisoxine serving as an organic luminous layer.

Magnesium fluoride and aluminum were co-deposited at a ratio of 1:1 (volume ratio) by means of an electrical resistance heating method to form an electron-injection layer having a layer thickness of 1 nm.

A thin layer having a thickness of 200 nm was formed by means of vapor deposition with aluminum to give a cathode.

In this way, an organic electroluminescent element was prepared.

Comparative Example 6

In example 11, indium was deposited by means of an electrical resistance heating method to form an electron-injection layer having a layer thickness of 1 nm.

Then, a thin layer having a thickness of 200 nm was formed by means of vapor deposition with aluminum to give a cathode. In this way, an organic electroluminescent element was prepared.

Comparative Example 7

In example 13, magnesium and aluminum trisoxine were co-deposited at a ratio of 2:1 (volume ratio) by means of an electrical resistance heating method to form an electron-injection layer having a layer thickness of 3 nm.

Then, a thin layer having a thickness of 200 nm was formed by means of vapor deposition with aluminum to give a cathode.

In this way, an organic electroluminescent element was prepared.

EXAMPLE 15

N,N'-diphenyl-N,N'-bis(1-naphtyl)-1,1'-diphenyl-4,4'-diamine was vapor-deposited as an organic hole-injection transporting layer on a glass substrate coated with indium tin oxide. The obtained layer had a thickness of 55 nm.

A thin layer having a thickness of 10 nm was formed by means of co-deposition with aluminum trisoxine doped with rubrene at 5% by weight serving as an organic luminous layer.

Aluminum trisoxine was vapor-deposited to form a thin electron transporting layer having a thickness of 45 nm.

Magnesium fluoride and indium were co-deposited at a ratio of 1:5 (volume ratio) by means of an electrical resistance heating method to form an electron-injection layer having a layer thickness of 2 nm.

A thin layer having a thickness of 200 nm was formed by means of vapor deposition with indium to give a cathode.

In this way, an organic electroluminescent element was prepared.

Comparative Example 8

An organic electroluminescent element was prepared in a manner similar to Example 15, except that an electron-injection layer was not formed.

Comparative Example 9

In example 15, magnesium fluoride was deposited by means of an electrical resistance heating method to form an electron-injection layer having a layer thickness of 2 nm.

Then, a thin layer having a thickness of 200 nm was formed by means of vapor deposition with indium to give a cathode.

In this way, an organic electroluminescent element was prepared.

EXAMPLE 16

N,N'-diphenyl-N,N'-bis(1-naphtyl)-1,1'-diphenyl-4,4'-diamine was vapor-deposited as an organic hole-injection transporting layer on a glass substrate coated with indium tin oxide. The obtained layer had a thickness of 55 nm.

A thin layer having a thickness of 10 nm was formed by means of co-deposition with aluminum trisoxine doped with rubrene at 5% by weight as an organic luminous layer.

Aluminum trisoxine was vapor-deposited to form a thin electron transporting layer having a thickness of 45 nm.

Yttrium fluoride and aluminum were co-deposited at a ratio of 1:1 (volume ratio) by means of an electrical resistance heating method to form an electron-injection layer having a layer thickness of 1 nm.

A thin layer having a thickness of 200 nm was formed by means of vapor deposition with aluminum to give a cathode.

In this way, an organic electroluminescent element was prepared.

EXAMPLE 17

4,4',4"-tris[N,N',N"-triphenyl-N,N',N"-tris(3-methylphenyl)]triphenylamine was vapor-deposited as a hole-injection layer on a glass substrate coated with indium tin oxide. The obtained layer had a thickness of 15 nm.

N,N'-diphenyl-N,N'-bis(4-methylphenyl)-1,1'-bis(3-methylphenyl)-4,4'-diamine was vapor-deposited as a hole-transporting layer on the hole-injection layer. The obtained layer had a thickness of 45 nm.

A thin layer having a thickness of 30 nm was formed by means of co-deposition with aluminum trisoxine doped with rubrene at 5% by weight as an organic luminous layer.

An oxadiazole compound represented by the formula (A) below was vapor-deposited to form an electron-transporting layer having a layer thickness of 30 nm.

(A)

Magnesium oxide and indium were co-deposited at a ratio of 1:3 (volume ratio) by means of an electrical resistance heating method to form an electron-injection layer having a layer thickness of 2 nm.

A layer having a thickness of 200 nm was formed by means of vapor deposition with magnesium to give a cathode.

In this way, an organic electroluminescent element was prepared.

Comparative Example 10

An organic electroluminescent element was prepared in a manner similar to Example 17, except that an electron-injection layer was not formed.

EVALUATION

A direct voltage was gradually applied to the organic electroluminescent elements obtained in Examples 1 to 17 and Comparative Examples 1 to 10 with the glass electrode as an anode. Luminescence-starting voltage (V), luminous brightness at 5V (cd/cm$^2$), and luminous brightness at 10V (cd/cm$^2$) were measured.

Each electroluminescent element was driven at current density of 5 mA/cm$^2$ for 5 hours. Then, maintaining ratio of initial output power (%) was measured as follows;

maintaining ratio of initial output power (%)=(output power (mW/cm$^2$) after 5 hours)/(initial output power (mW/cm$^2$))×100

The result are summarized in Table 1 and Table 2.

TABLE 1

| | Luminescence Starting Voltage (V) | Luminous Brightness at 5 V (cd/m$^2$) | Luminous Brightness at 10 V (cd/m$^2$) | Maintaining Ratio of initial output power (%) |
|---|---|---|---|---|
| Example 1 | 3.5 | 12 | 410 | 90 |
| Example 2 | 3.0 | 51 | 5240 | 95 |
| Example 3 | 3.0 | 62 | 7440 | 93 |
| Example 4 | 3.0 | 82 | 14530 | 94 |
| Comparative Example 1 | 9.0 | 0 | 20 | 43 |
| Example 5 | 3.0 | 70 | 10160 | 91 |
| Comparative Example 2 | 4.0 | 25 | 3942 | 77 |
| Comparative Example 3 | 3.5 | 34 | 4590 | 80 |
| Comparative Example 4 | 8.0 | 0 | 50 | 57 |
| Example 6 | 3.0 | 80 | 12940 | 92 |
| Example 7 | 3.0 | 90 | 14970 | 93 |
| Example 8 | 3.5 | 55 | 6100 | 90 |
| Example 9 | 3.0 | 75 | 10350 | 92 |

TABLE 1-continued

| | Luminescence Starting Voltage (V) | Luminous Brightness at 5 V (cd/m$^2$) | Luminous Brightness at 10 V (cd/m$^2$) | Maintaining Ratio of initial output power (%) |
|---|---|---|---|---|
| Example 10 | 3.5 | 18 | 1700 | 89 |
| Comparative Example 5 | 3.5 | 37 | 4725 | 83 |

TABLE 2

| | Luminescence Starting Voltage (V) | Luminous Brightness at 5 V (cd/m$^2$) | Luminous Brightness at 10 V (cd/m$^2$) | Maintaining Ratio of initial output Power (%) |
|---|---|---|---|---|
| Example 11 | 3.0 | 85 | 15310 | 95 |
| Example 12 | 3.0 | 71 | 12440 | 94 |
| Example 13 | 3.0 | 68 | 11750 | 94 |
| Example 14 | 3.0 | 75 | 13930 | 94 |
| Comparative Example 6 | 5.0 | 2 | 530 | 66 |
| Comparative Example 7 | 3.5 | 39 | 4650 | 80 |
| Example 15 | 3.0 | 65 | 9260 | 93 |
| Comparative Example 8 | 5.0 | 1 | 420 | 64 |
| Comparative Example 9 | 6.0 | 0 | 370 | 65 |
| Example 16 | 3.0 | 50 | 7950 | 92 |
| Example 17 | 3.5 | 39 | 6570 | 90 |
| Comparative Example 10 | 8.5 | 0 | 25 | 51 |

As is apparent from Tables and 2, an organic electroluminescent element of the present invention can start to emit light at a low voltage and shows good luminous brightness.

An organic electroluminescent element of the present invention can keep initial light-emission for a long period of time stably.

What is claimed is:

1. An organic electroluminescent element comprising:
an anode;
an organic luminous layer;
an electron-injection layer comprising (1) at least one of a metal oxide and a metal halide, and (2) a material different from (1) selected from the group consisting of an electron transporting material and a metal; and
a cathode,
wherein the electron-injection layer has a thickness of 0.1 to 20 nm.

2. The organic electroluminescent element according to claim 1, wherein the metal has a work function of more than 4.2 eV.

3. The organic electroluminescent element according to claim 1, wherein a mixing ratio of the metal to the at least one of the metal oxide and the metal halide is 1:20 to 20:1.

4. The organic electroluminescent element according to claim 1, wherein the electron transporting material is an organic compound.

5. The organic electroluminescent element according to claim 1, wherein the at least one of the metal oxide and the metal halide has a work function of less than 4.2 eV.

6. The organic electroluminescent element of claim 1, in which the electron-injection layer comprises at least (1) the metal halide and (2) the electron transporting material or the metal, said metal being different from the metal of the metal halide, and the metal halide is selected from the group consisting of magnesium fluoride, calcium fluoride, yttrium fluoride, lithium fluoride and lithium bromide.

7. The organic electroluminescent element of claim 1, in which the electron-injection layer comprises at least (1) the metal oxide and (2) a charge transporting material or a metal different from the metal of the metal oxide, and the metal oxide is selected from the group consisting of magnesium oxide, yttrium oxide and lithium oxide.

8. The organic electroluminescent element of claim 1, in which the electron-injection layer is formed by co-deposition of (1) at least one of the metal oxide and the metal halide, and the material different from (1).

9. The organic electroluminescent element according to claim 1, in which the electron-transporting layer is formed between the electron-injection layer and the organic luminous layer.

10. The organic electroluminescent element according to claim 1, in which the cathode is formed of a metal selected from the group consisting of aluminum, silver and indium.

11. The organic electroluminescent element according to claim 1, in which a sealing layer is formed on the cathode.

12. The organic electroluminescent element according to claim 1, further comprising a hole-injection transporting layer.

13. The organic electroluminescent element according to claim 1, further comprising a hole-injection layer and a hole-transporting layer.

14. The electroluminescent element of claim 1, which the electron transporting material is also contained in the luminous layer.

15. The organic electroluminescent element according to claim 1, wherein a mixing ratio of the electron transporting material to the at least one of the metal oxide and the metal halide is 100:1 to 1.2:1.

16. The organic electroluminescent element according to claim 1, wherein a mixing ratio of the electron transporting material to the at least one of the metal oxide and the metal halide is 20:1 to 1:1.

17. The organic electroluminescent element of claim 1, in which the electron transporting material is selected from the group consisting of nitro-substituted fluorenone, anthraquinodimethane, diphenoquinone, thiopyrandioxide, oxadiazole, triazole, thiadiazole, cumarin, a chelated oxynoid compound, and derivatives thereof.

18. The organic electroluminescent element of claim 1, wherein the electron transporting material is an organic compound.

19. An organic electroluminescent element comprising, an anode;

an organic luminous layer;

an electron-injection layer comprising (1) at least one of a metal oxide and a metal halide, and (2) a material different from (1) selected from the group consisting of an electron transporting material and a metal; and a cathode, wherein a mixing ratio of the metal to the at least one of the metal oxide and the metal halide is 1:100 to 100:1.

20. An organic electroluminescent element comprising:

an anode;

an organic luminous layer;

an electron-injection layer comprising (1) at least one of a metal oxide and a metal halide, and (2) a material different from (1) selected from the group consisting of an electron transporting material and a metal; and a cathode, wherein the mixing ratio of the electron transporting material to the at least one of the metal oxide and the metal halide is 100:1 to 1:1.2.

21. The organic electroluminescent element of claim 20, wherein the electron transporting material is an organic compound.

* * * * *

UNITED STATES PATENT AND TRADEMARK OFFICE
CERTIFICATE OF CORRECTION

PATENT NO.     : 6,395,409 B2
DATED          : May 28, 2002
INVENTOR(S)    : Hideaki Ueda et al.

It is certified that error appears in the above-identified patent and that said Letters Patent is hereby corrected as shown below:

<u>Title page,</u>
Item [45], Date of Patent: before "May 28, 2002, please add -- * --.
Item [*] Notice:
Please add -- This patent issued on a continued prosecution application filed under 37 CFR 1.53 (d), and is subject to the twenty year patent term provisions of 35 U.S.C. 154(a)(2). --

Signed and Sealed this

Eighth Day of October, 2002

*Attest:*

*Attesting Officer*

JAMES E. ROGAN
*Director of the United States Patent and Trademark Office*